United States Patent [19]

Herron et al.

[11] Patent Number: 4,879,156
[45] Date of Patent: Nov. 7, 1989

[54] MULTILAYERED CERAMIC SUBSTRATE HAVING SOLID NON-POROUS METAL CONDUCTORS

[75] Inventors: Lester W. Herron; Robert O. Lussow; Robert W. Nufer, all of Hopewell Junction; Bernard Schwartz, Poughkeepsie; John Acocella, Hopewell Junction; Srinivasa N. Reddy, Lagrangeville, all of N.Y.

[73] Assignee: International Business Machines Corporation, Armonk, N.Y.

[21] Appl. No.: 167,607

[22] Filed: Mar. 14, 1988

Related U.S. Application Data

[62] Division of Ser. No. 859,092, May 2, 1986, Pat. No. 4,753,694.

[51] Int. Cl.⁴ ................................................. B32B 9/00
[52] U.S. Cl. ......................................... 428/137; 428/209;
428/210; 428/332; 428/426; 428/432; 428/433;
428/901; 428/212; 174/68.5; 361/397
[58] Field of Search ..................... 174/68.5; 156/89;
428/209, 210, 901, 137, 212, 332, 426, 432, 433;
361/397

[56] References Cited

U.S. PATENT DOCUMENTS

| | | | |
|---|---|---|---|
| 3,852,877 | 12/1974 | Ahn et al. | 264/58 |
| 3,879,509 | 4/1975 | Elderbaum | 264/61 |
| 4,221,047 | 9/1980 | Narken et al. | 29/840 |
| 4,234,367 | 11/1980 | Herron et al. | 156/89 |
| 4,301,324 | 11/1981 | Kumar et al. | 174/52 FP |
| 4,642,148 | 2/1987 | Kurihara et al. | 428/209 |
| 4,761,325 | 8/1988 | Kurihara et al. | 428/209 |
| 4,766,027 | 8/1988 | Burn | 428/210 |

OTHER PUBLICATIONS

IBM Journal of R & D, MLC Manufacturing, Burger et al., vol. 27, No. 1, 1983, pp. 11–19.

*Primary Examiner*—Ellis P. Robinson
*Assistant Examiner*—P. J. Ryan
*Attorney, Agent, or Firm*—Ira D. Blecker

[57] ABSTRACT

A multilayered ceramic (MLC) substrate having embedded and exposed conductors suitable for mounting and interconnecting a plurality of electronic devices exterior thereof. The horizontal planar conductors comprise substantially a plurality of solid, non-porous, homogeneous metal patterns, whereas the vertical interplanar connection conductors are substantially porous metal conductors that are formed by methods such as screening. The process to form the MLC substrate involves forming a pattern of solid, nonporous conductors to a backing sheet having a release layer, then transferring the pattern to a ceramic green sheet. Zero X-Y shrinkage sintering processes allow the MLC substrate and solid metal conductors to be densified without distortion of the solid metal patterns or the ceramic.

12 Claims, 1 Drawing Sheet

FIG. 2A"

MULTILAYERED CERAMIC SUBSTRATE HAVING SOLID NON-POROUS METAL CONDUCTORS

This application is a divisional application of Ser. No. 859,092, filed May 2, 1986, now U.S. Pat. No. 4,753,694.

CROSS REFERENCE TO RELATED APPLICATION

This application is related co-pending application Ser. No. 859,093, now U.S. Pat. No. 4,753,394, filed concurrently herewith and entitled "Method and Means for Co-Sintering Ceramic/Metal MLC Substrates", the disclosure of which is incorporated herein by reference.

BACKGROUND OF THE INVENTION

This invention relates to multilayer ceramic substrates particularly adapted for mounting and interconnecting semiconductor chips.

The application wherein the instant invention has its greatest utility is in a multi-chip module for use in data processing equipment. This application and the then state-of-the-art multi-chip module, as well as the method of fabricating the multilayer ceramic (MLC) substrate is described by A. J.. Blodgett and D. R. Barbour in an article entitled "Thermal Conduction Module: A High Performance Multi-layer Ceramic Package" published in the *IBM Journal of Research and Development*, Vol. 26, No. 1, January 1982, page 30 et seq.

The foregoing highlights the cycle time reduction achieved by the thermal conduction model over prior methods of interconnecting circuit components.

A further dissertation on multilayer ceramic fabrication can be found in the article by W. G. Berger and C. W. Weigel entitled "Multi-Layer Ceramics Manufacturing" appearing in the *IBM Journal of Research and Development*, Vol. 27 No. 1, Page 11, et seq.

The circuit density and quantity of the discrete circuit elements in a chip is ever increasing, as is the speed of operation of the chips. Derivatively, the so-called "footprint" density of the chip i.e., the number of chip circuit pads per unit area for connection to the multilayer ceramic (MLC) substrate, is increasing. This necessitates a corresponding increase in the "footprint" density of the complementary pad pattern of the MLC substrate. The increase in the number of pads per chip requires an increase in the number of inter-chip conductors.

While one can increase the number of layers in the MLC substrate to provide more complex interconnecting metal patterns, this is not without penalty. Any increase in conductor length increases circuit delays. Adding layers increases fabrication difficulties. It does not solve the footprint density problem unless there can be found a means for depositing a finer, more closely spaced metallization pattern on the MLC substrate.

Prior art MLC substrates utilize processed metal powders, i.e. metal particles that are screened and subsequently sintered to form metal patterns on the respective lamina, interconnected by sintered metal in via holes penetrating the laminae at selected positions. The metal patterns were applied to the green sheet laminae by a screening and subsequent sintering process. This process is incapable of producing very small closely spaced conductors, and cannot produce the complementary footprint for the advanced generation of chips. Even if it were capable, metallurgy formed by screening processes or other metal particle processes, and subsequently sintered has too high of a resistivity to permit the use of small area conductors.

The problem of resistivity was partially addressed by Ahn et al. in U.S. Pat. No. 3,852,877 wherein they formed sintered metal-lined "burrows" in the fired MLC substrate and subsequently filled the burrows with molten metal of high conductivity, such as with copper, to provide the interconnecting metal pattern. Ahn, et al describes their invention as "the formation of metallized capillaries within a multilayer ceramic circuit board, which capillaries are subsequently filled with a high conductivity metal".

Since the capillaries are lined with a refractory metal and filled with molten metal after the substrate is fired, the conductive network consisted of solid metal and sintered refractory metal. Thus, the density of the conductive network was not only limited by the screening process, but also by the necessity of having lined capillaries through which the molten metal could subsequently flow. The via holes and metal paste pattern in one of the described embodiments were 10 mils. In another embodiment a porous capillary, as opposed to a lined capillary, received the molten metal.

If fine, closely-spaced, non-screened metal conductors are to be used in a MLC substrate, the metal must be deposited by a process other than screening and the metal must have a melting temperature higher than the sintering temperature of the ceramic. The metal must also have a low resistivity. The chosen ceramic must either have zero shrinkage upon firing or be restrained from shrinkage. The above-cited co-filed patent application describes various ceramics and methods for restraining shrinkage during firing, as does U.S. Pat. No. 3,879,509.

The use of glass ceramics which can be fired at temperatures lower than the melting points of high conductivity metals for MLC substrates has been discussed at length in U.S. Pat. Nos. 4,234,367; 4,301,324; 4,340,436; and 4,413,061. Glass ceramics not only have this desirable property, but also they have a low dielectric constant, high flexural strength and have a low thermal coefficient of expansion, all most desirable for high speed electronic applications.

The techniques for producing microscopically small metallized patterns on semiconductor chips is well known in the art. If these could be adapted for producing the metal patterns on the MLC laminae, one could not only achieve the dense footprint, but the fine, closely-spaced conductors. However, these semiconductor device metallization processes are not suited for directly metallizing the greensheet laminae of an MLC substrate. The greensheets do not have a sufficiently smooth surface to receive the fine close-spaced metal patterns directly without risk of rupture or alteration of the critical inter-conductor spacing. Also, any metallization process involving subatmospheric pressure would be severely impacted by organic outgassing of binder materials, changing greensheet composition (for example, making sheets stiff), and contaminating the processing system.

It is therefore necessary to find an alternative to depositing the fine metal pattern directly on the greensheet.

SUMMARY OF THE INVENTION

It is therefore an object of this invention to fabricate a multilayer ceramic substrate for use in mounting and interconnecting electronic devices by depositing a predetermined pattern of solid metal conductors on each of a plurality of backing sheets, transferring each of said patterns to a respective unfired ceramic greensheet, laminating said greensheets in alignment with one another, and sintering the laminated greensheets at a temperature lower than the melting point of the metal conductors while restraining the laminated ceramic from shrinkage in the X and Y directions.

Another object is to transfer the metal pattern to a preformed greensheet and stripping off the backing sheet.

An even further object is to provide a multilayer ceramic substrate having embedded and exposed conductor members suitable for mounting and interconnecting a plurality of electronic devices exterior thereto, consisting solely of a plurality of interconnected layers of solid metal, non-screened conductor patterns encapsulated in a sintered ceramic substrate.

BRIEF DESCRIPTION OF THE DRAWINGS

FIG. 2A' shows an alternative to solid metal vias wherein the via may be capped with an alloy.

FIG. 2A" shows a metal pattern on a backing sheet, that has been aligned and bonded to a greensheet having punched and paste-filled vias.

DESCRIPTION OF THE PREFERRED EMBODIMENTS

Figure 1:
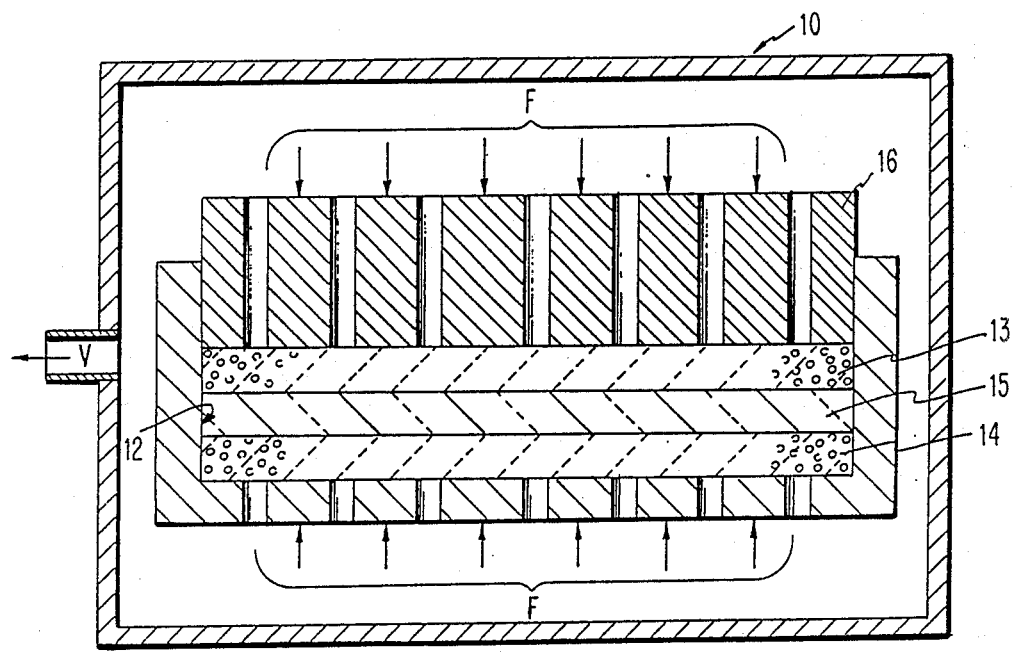
FIG. 1 shows the greensheet laminate in a zero shrinkage subassembly in an atmosphere controlled furnace.

The circuitry in the individual chips and the required function of the multi-chip module dictates the necessary interconnections between the chips and the connections to the pins or other external module contacts. The "footprint" of each of the chips fixes the geometry of the complementary pads on the MLC substrate to which the chips are connected. While these prerequisites dictate what shall be interconnected and the geometry, they do not dictate the paths that the interconnects must follow.

The circuit designer determines the optimum configuration of the interconnecting metal patterns within the substrate to distribute power to the chips and to so configure the signal-carrying conductors to achieve the desired impedance match, to minimize crosstalk between signal lines, and to maximize the speed of operation. It is axiomatic that increasing conductor length increases both the resistance and capacitance of a circuit consisting of closely spaced conductors. A design criteria, therefore, is to reduce conductor length. A reduction in conductor cross-section increases resistance and decreases capacitance. Reducing spacing between conductors has no effect upon resistance, but increases inter-conductor capacitance. However, the reduction in inter-conductor spacing, if it results in an overall increase in metallization density, may produce an offsetting reduction in conductor length, thus decreasing the RC time constant of the circuit.

Solid metal conductors have a lower resistance per unit length than metal particle processed i.e., screened and subsequently sintered metal conductors of comparable cross-section. Therefore, solid metal conductors, preferably of copper, are necessary if fine closely spaced conductors are to be used.

The circuit designer evolves the optimum structure to fulfill his requirements using computer-aided design techniques to compromise the conflicting phenomena. However, the circuit designer's structure requires further modification to make his proposed structure compatible with the process requirements for fabricating MLC substrates, including materials compatibility, temperature compatibility, economy of fabrication, yield and many other factors.

The metal chosen for the conductors cannot melt at a temperature lower than the sintering temperature of the MLC material. The MLC material should have a high resistivity and low dielectric constant and should have the requisite physical properties. Because one is fixing the dimension of the fine metal pattern, the MLC material cannot be allowed to shrink in the X and Y directions during sintering, lest it fracture the metal conductors or alter the circuit parameters, as, for example, by distorting the interconductor spacing.

The MLC structure per se can be summarized in that it consists of only solid, metal conductors encapsulated in a sintered ceramic substrate with means (i.e., vias) for electrically interconnecting the conductors. The solid, conductors are substantially homogeneous, thus the bulk electrical and mechanical properties of the conductive metallurgy are kept intact. This is as opposed to metal conductors consisting of screened and subsequently sintered metal conductors. An example of the importance of this is that the electrical conductivity of a solid, homogeneous copper line is approximately twice as high as for a screened and subsequently sintered copper line. Generally, interplanar connection vias are still formed as composite sintered conductors, but selected vias may also be made of solid, homogeneous conductors. The materials for this MLC substrate are chosen so that the sintering temperature of the specific ceramic material used is lower than the melting point of the metal conductors utilized in the package, i.e., copper, gold, silver or other conductive (i.e., resistivity less than $2 \times 10^{-6}$ ohm cm) elements or alloys. More specifically, the ceramic material typically has a sintering temperature lower than 1000° C, thus the metal conductors utilized should have a melting point greater than 1000° C.

The patterns of metal on a typical MLC structure made in accordance with the present invention have pads on the top surface that are complementary to the exposed I/O pads of semiconductor chips. The typical dimensions of the conductors are in the range of approximately 0.5 to 4 mils, on spacings of approximately 1 to 16 mils. Other dimensions may be utilized also, for example, fine line applications are anticipated wherein line widths are in the range of approximately 2-10 micrometers. The interplanar connections between metal patterns may be solid metal studs, screened conductive paste, or studs coated with an alloy of a metal which is interposed between the studs and patterns connected thereto. The interposed metal having a melting point approximately equal to the sintering temperature of the selected ceramic.

The method of making the MLC substrate can be summarized by the steps of depositing a metal and forming the respective planar metal conductive patterns on discrete areas of a smooth dimensionally stable backing sheet, transferring each of the metal patterns, thus formed, to each respective greensheet lamina, laminating the greensheets in registry with one another and sintering the laminated structure while restraining it against shrinkage and warpage.

During sintering, the laminated greensheets are restrained against lateral shrinkage, transverse distortion and deformation. Preventing shrinkage is key to successfully forming the structure of the present invention without distorting the solid metal patterns or cracking or deforming the ceramic. A preferred method of preventing shrinkage and deformation is by sandwiching a laminated stack of greensheets between two porous platens, each of which has a sintering temperature higher than the greensheets, and then applying a z-direction force to the platens.

As assurance of zero-shrinkage, a structure that is coextensive with the lateral dimensions of the MLC structure may encircle the platens and substrate.

The metal conductive layer for each of the planar spaced-apart metal patterns is deposited and photolithographically formed into a pattern on a smooth dimensionally stable sheet coated with a release material, preferably a polyethylene terephthlate (PET) sheet coated with polyvinyl butyral. The sheet may also typically be made of other stable, organic polymeric films (i.e. polyimide), or metal sheets, or combinations thereof. The coating may also typically be made of other depolymerizable polymeric materials such as alpha-methyl styrene, polyisobutylene or polymethylmethacrylate (PMMA). The coating should be compatible with the binders so that there is controlled adhesion between each dimensionally stable sheet and circuit metallurgy pattern, i.e., there must be adequate adhesion between the metal and coating layer so that the metal adheres to the coating during the photolithography steps required to pattern the metal layer, while there must be greater adhesion between the metal and greensheets than between the metal and coating. The deposition process may be any one of several, which is capable of producing the requisite fine, closely-spaced solid metal conductors.

Glass-ceramic greensheets are then prepared in accordance with the teaching of the Kumar et al. U.S. Pat. No. 4,301,324 and the Herron et al. U.S. Pat. No. 4,234,367 including the punching and screening of via holes. The via holes are typically filled by conventional techniques with a conductive metal paste which is sinterable at a temperature compatible with the sintering temperature of the glass ceramic. A preferred via-filling paste for use with solid copper conductors is copper paste. As will be shown in the examples to follow, interconnections between planes of patterned metal can be made by metallized studs or alloy capped studs. Each of the metal patterns is then overlaid on its respective prepunched via filled greensheets in precise registry therewith.

Each greensheet with its aligned metal patterns and backing sheet is then placed into a heated press to securely bond the conductors into the greensheet material.

The backing sheet is then stripped from the now metallized greensheets and the respective laminae stacked in precise alignment and laminated in the manner described in U.S. Pat. No. 4,234,367.

When the thus-laminated MLC is sintered, the release layer, i.e. butyral, is burned off, and the copper metallizing via paste is sintered to conductively connect to the solid metal patterns. During sintering, as will be described, the glass ceramic is restrained to prevent shrinkage in the X-Y directions and allowing sintering movement only in the Z direction.

An alternative to the use of filled vias is the deposition of the planar metal patterns on the coated PET substrate followed by an extra-deposition of studs in the selected areas of the planar patterns wherein it is necessary to connect the pattern to an area of a pattern in an adjacent sheet. This is in lieu of a filled via for interconnecting adjacent patterns.

The raised studs then receive an overlay of a metal which will melt during the subsequent sintering cycle to join the studs to any abutting metal in the next succeeding metallization layer. The greensheet slurry is then cast directly upon the metallized patterned backing sheets in the same manner as slurry has heretofore been cast upon a PET backing sheet. Thus casting the slurry around the conductors very effectively embeds them in the greensheet and does not distort the conductors. The thickness of the greensheet is controlled such that the raised studs will project slightly above the surface of the greensheet after drying thereof. After conventional drying the PET backing is stripped away from the greensheets to expose the embedded metal patterns, still coated with butyral or PMMA, etc. The tops of the exposed studs are covered with an alloy having a melting point equal to the sintering temperature, which alloy when melted will fuse the abutting pattern and stud into a conducting path.

The greensheets are then stacked in registry and laminated and sintered, during which time the overlain metal on the studs melts to provide an adherent bridge between the studs and the abutting areas of the next layer of metallization. During sintering the MLC laminate is restrained against lateral shrinkage and transverse bowing, and the butyral, PMMA, etc. is burned of . Referring to FIG. 1, a typical sintering subassembly for accomplishing this is shown in an atmosphere controlled furnace 10. In FIG. 1, the laminate 15 may be placed between two porous alumina tiles 13, 14, and placed in fixture 12 which prevents sidewall movement. Subfixture 16 provides uniform loading, while allowing oxygen to reach the laminate to enhance binder burnoff.

The foregoing overview of the process is carried in the following succession of steps:

EXAMPLE I

Figure 2A:
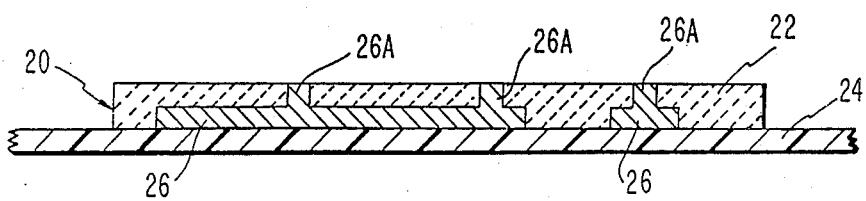
FIG. 2A shows a solid metal pattern having solid conductive studs, with the backing sheet still present. A greensheet slurry is cast over the metal to form the patterned greensheet.
Figure 2A:
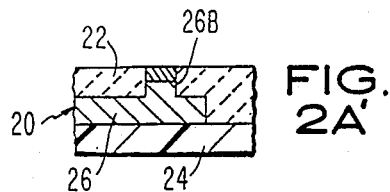

This example demonstrates the use of a greensheet having punched and screened paste vias used in conjunction with a solid metallized backing sheet. FIG. 2A" is indicative of this type of structure.

Step 1

A PET backing sheet is covered with a thin layer of polymethylmethacrylate by spraying or roll coating.

Step 2

A layer of blanket metal of the desired conductor thickness is applied to the backing sheet 24 by roll-laminating a foil of the metal to the sheet or by other conventional means such as building up the desired thickness by sputtering or evaporating the metal.

Step 3

The metal layer supported by the sheet is then subjected to standard photolithographic and etching processes, leaving behind the desired conductive metal pattern 26. Note that if liftoff or other thin film techniques are used, lines can be made in the range of approximately 3–6 microns. Thin lines can also be used in packaging structures such as those described in U.S. Pat. 4,221,047 which incorporate thin film redistribution layers over an MLC structure.

Step 4

For standard packages today, these patterns typically have a conductor width of approximately 2 mils, a height of approximately 1 mil and an interconductor spacing of approximately 2 mils.

A plurality of glass-ceramic greensheets 22 such as that taught by the Kumar et al U.S. Pat. No. 4,301,324 are cast on a separate PET sheet in conventional manner, dried, trimmed to size and perforated with aligning holes and via openings to provide the respective MLC laminae.

Step 5

The via holes in each of the thus-prepared sheets are filled with a conductive copper paste as shown by reference numeral 26C in FIG. 2A''. Note that vias 26A and 26B shown in FIGS. 2A and 2A' respectfully represent solid metal conductors which are used in place of vias 26C in the process disclosed in Example 2.

Step 6

Each of the metal-patterns 26 together with its backing sheet 24 is overlaid in precise alignment with its respective greensheet 22 and compressed in a press with a pressure of approximately 300 psi, a temperature of approximately 75-95° C., for approximately 2 minutes to bond the conductors in the greensheet. Note that the exact pressure required is a function of the flatness of the ceramic green sheets, and that exact temperature is a function of the backing sheet and release agent used.

Step 7

The PET backing sheet is then stripped off leaving the metal pattern 26 on each of the ceramic greensheets 22.

Step 8

The greensheets are then stacked in precise alignment by means of the pre-perforated locating holes, and laminated at high pressures, the precise pressure depending upon geometry of conductors, thickness of greensheets and thickness of total substrate, i.e. at least approximately 3000 psi. The purpose of the lamination, is to securely bond the solid metal conductor pattern onto the ceramic greensheet, and to provide a self-adhering unitary structure.

Step 9

The thus laminated structure 15 is then sintered in a press such as that shown in FIG. 1 wherein the press comprises a rectilinear cavity 12 whose X and Y dimensions equal the X and Y dimensions of the MLC end product, and the bottom of which is perforated. This confines the laminated structure from expanding under a transverse compressive force. Upper and lower platens 13 and 14 having X and Y dimensions coextensive with the cavity sandwich the MLC laminate 15 between them.

The platens 13 and 14 are backed up by a rigid metal platen 16 and the bottom of the cavities 12 which are perforated to permit the escape of gases during sintering. The platens 13 and 14 are fabricated of a porous ceramic having a higher sintering temperature than that of the glass-ceramic laminated structure 15 so that they do not sinter during the process and thus do not shrink.

These platens are preferably made of a presintered, porous $Al_2O_3$ and glass body, which when pressed against the laminated glass-ceramic structure, provide a frictional restraining force to prevent X-Y shrinkage and distortion in the Z direction.

The sintering of the laminated assembly (See FIG. 1) in its press is conducted by the following successions of temperatures, compressive forces, ambient pressures and time.

(a) applying pressure to prevent X-Y shrinkage during sintering while allowing densification in the Z direction, (i.e. 1–200 psi).
(b) raising the temperature at a rate of approximately 1–4° C./min. to approximately 720°–740° C. in a nitrogen ambient.
(c) holding at approximately 720°–740° C. in a H2/H20 ambient for approximately 30 hours.
(d) raising the temperature at a rate of 2° C./min. to approximately 965° C. and then holding the temperature for approximately 2 hours in a nitrogen atmosphere.
(e) lowering the temperature at a rate of approximately 5° C./min. to room temperature.

EXAMPLE II

This example demonstrates the use of a metallized (solid metal) backing sheet used with studded (solid metal) vias subsequently coated with glass ceramic slurry to form metallized greensheet layers. This is best shown in FIG. 2A.

Step 1

Planar metal patterns 26 are prepared as in Steps 1 and 2 of Example I, except that a thicker metal layer is typically used here.

Step 2

The metal layer supported by the sheet is then subjected to a two-step photolithographic/etch process, leaving behind the desired metal pattern. In the first step, the line pattern is etched, and in the second step, the stud pattern (see studs 26A, FIG. 2A) is etched. The surface of the exposed studs may optionally be coated with silver forming a Cu-silver alloy having a melting point of 900° C., which alloy will, when melted, provide a conductive connection between the studs and the next overlying planar pattern. This is shown in FIG. 2A' where the coated stud is referenced by numeral 26B.

Step 3

The glass-ceramic slurry is then cast over the planar metal patterns to the height of the studs.

The resultant structure 20 is as shown schematically in FIG. 2A or 2A' The ceramic slurry 22 is cast directly on the coated PET backing sheet 24, upon which the planar metal patterns 26 have been deposited. After the greensheet slurry has dried, alignment holes are punched and the backing sheet stripped away. The studs 26A and 26B are flush with the top surface of the resultant greensheet 22 as shown in FIGS. 2A and 2A'.

Step 4

The surface of the greensheet and the exposed studs are cleaned of excess greensheet material.

Step 5

Figure 2B:
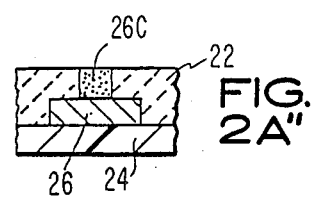
FIG. 2B shows a portion of the laminate after the backing sheet is removed.
Figure 2B:
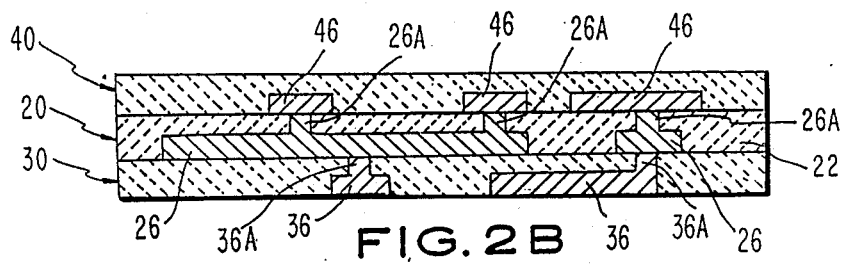

The greensheets are then stacked in aligned relationship, using the alignment holes. The stacked assembly is shown schematically in FIG. 2B, which shows solid metal studs 26A. Note that it is alloy capped vias 26B also. The lamina 20 (i.e., FIG. 2A) is sandwiched between laminae 30 and 40. The studs 26A or 26B abut the bottom of the planar pattern 46. At the lower level studs 36A connect with planar pattern 26 of the midlevel 28.

The foregoing Figures are diagrammatic to illustrate the principle of the interconnection. If, for example, a connection were desired between two or more nonadjacent laminations, a pad would be deposited and a stud deposited upon it. The pad would have sufficient area and adhesion so as to retain its location when the backing sheet is stripped away.

Step 6

Step 6 is the same as step 8 of Example I. The only difference is that the alloy on the tips of the studs now melts to fuse the stud to the abutting metallization of the next adjacent lamina, instead of having the sintered metal in the vias effecting the interconnection. This allows some Z shrinkage. The stud having an alloy tip is shown as reference numeral 26B in FIG. 2A'.

With the foregoing steps in both Examples I and II, the planar solid metal patterns deposited on the backing sheet can have smaller, more closely spaced conductors, thus reducing the number of laminae necessary to connect the denser chips and to interconnect more chips per module. The restraint of shrinkage an bowing during sintering by means of the sandwich technique protects the metal patterns against distortion and preserves their as-deposited geometry. No substantial geometric changes of the metal are desired, therefore, the metal and ceramic chosen to form a specific package must be chosen so that the metal can withstand ceramic sintering temperatures without vaporization or deformation. The resultant solid conductors are substantially nonporous and homogeneous, thus preserving the bulk properties of the metal conductors used (i.e. lower resistivity than copper paste conductors). The zero X-Y shrinkage capabilities allow the ceramic and solid metal conductors to be densified without distortion of the solid metal patterns or the ceramic.

While the present invention has been disclosed in connection with the preferred embodiment thereof, it should be understood that there may be other embodiments which fall within the spirit and scope of the invention as defined by the following claims.

What is claimed is:

1. A multilayer ceramic substrate having a network of exposed and encapsulated metal conductors adapted for mounting and interconnecting a plurality of electronic devices exterior thereof consisting solely of;
   a monolithic sintered ceramic body,
   an exposed pattern of solid metal conductors on the surface of said body,
   a plurality of spaced-apart planar patterns of solid metal conductors encapsulated in said body, each of which has a predetermined configuration, and
   means provided conducting pathways between predetermined areas of said spaced-apart planar patterns and between predetermined areas of said spaced-apart planar patterns and predetermined areas of said exposed pattern of solid metal conductors;
   wherein the ceramic material has a lower sintering temperature than the melting point of said metal conductors; and
   wherein said ceramic substrate has been sintered at a temperature less than the melting point of said metal conductors but high enough to densify the ceramic material, while simultaneously restraining the ceramic substrate from shrinkage in the X and Y directions.

2. The multilayer ceramic substrate of claim 1 wherein the ceramic material has a sintering temperature lower than 1000° C. and the solid metal conductors have a melting point greater than ° C.

3. The multilayer ceramic substrate of claim 1 wherein the ceramic is a glass ceramic.

4. The multilayer ceramic substrate of claim 1 wherein the metal conductors have a resistivity less than $2 \times 10^{-6}$ ohm-cm.

5. The multilayer ceramic of claim 4 wherein the solid metal of the conductor is selected from a group consisting of copper, silver, gold or alloys of silver and copper.

6. The multilayer ceramic substrate of claim 1 wherein said exposed pattern of solid metal conductors is provided with pads having patterns complementary to the exposed pads of semiconductor chips to be conductively affixed thereto.

7. The multilayer ceramic substrate of claim 1 wherein said planar patterns of solid metal conductors comprise a plurality of discrete spaced-apart linear conductors substantially co-planar.

8. The multilayer ceramic substrate of claim 7 wherein said linear conductors have a width in the range of 0.5 to 4 mils and an interconductor spacing in the range of 1 to 16 mils.

9. The multilayer ceramic substrate of claim 7 wherein said linear conductors have a width in the range of 2–10 micrometers.

10. The multilayer ceramic substrate of claim 1 wherein said means providing conducting pathways between said predetermined areas of said spaced-apart planar patterns and between predetermined areas of said spaced-apart planar patterns and predetermined areas of said exposed pattern of solid metal conductors, comprise sintered metal conductors in via holes.

11. The multilayer ceramic substrate of claim 1 wherein said means providing conducting pathways between adjacent spaced-apart planar patterns comprise thickened studs on the adjacent patterns and a metal interposed therebetween, said interposed metal having a melting point substantially equal to the sintering temperature of the selecting ceramic.

12. The multilayer ceramic substrate of claim 1 wherein the solid pattern of exposed metal conductors on the surface of said body comprise thickened studs raised from the pattern of the next adjacent planar pattern of solid conductors, said studs protruding outside of said body.

* * * * *